United States Patent
Qian (10) Patent No.: US 8,464,187 B1
(45) Date of Patent: Jun. 11, 2013

(54) INTEGRATED CIRCUIT HAVING DIRECTION DEPENDENT WIRING

(76) Inventor: Qi-De Qian, Santa Clara, CA (US)

( * ) Notice: Subject to any disclaimer, the term of this patent is extended or adjusted under 35 U.S.C. 154(b) by 0 days.

(21) Appl. No.: 13/547,444

(22) Filed: Jul. 12, 2012

Related U.S. Application Data (60) Continuation of application No. 12/181,483, filed on Jul. 29, 2008, now Pat. No. 8,266,557, which is a division of application No. 10/907,814, filed on Apr. 15, 2005, now Pat. No. 7,448,012.

(60) Provisional application No. 60/564,082, filed on Apr. 21, 2004, provisional application No. 60/603,758, filed on Aug. 23, 2004.

(51) Int. Cl.
*G06F 17/50* (2006.01)

(52) U.S. Cl.
USPC .............................. 716/54; 716/52; 716/55

(58) Field of Classification Search
USPC ................................ 716/52, 54–55
See application file for complete search history.

(56) References Cited

U.S. PATENT DOCUMENTS

| | | | | |
|---|---|---|---|---|
| 5,241,185 A * | 8/1993 | Meiri et al. | ................. | 250/492.2 |
| 5,258,920 A * | 11/1993 | Haller et al. | ................... | 716/130 |
| 5,442,569 A * | 8/1995 | Osano | ........................... | 716/107 |
| 5,612,893 A * | 3/1997 | Hao et al. | ......................... | 716/55 |
| 5,825,660 A * | 10/1998 | Cagan et al. | ....................... | 703/2 |
| 5,959,871 A * | 9/1999 | Pierzchala et al. | ................. | 703/4 |
| 5,984,510 A * | 11/1999 | Guruswamy et al. | ............ | 716/54 |
| 6,083,275 A * | 7/2000 | Heng et al. | ...................... | 716/52 |
| 6,189,132 B1 * | 2/2001 | Heng et al. | ..................... | 716/122 |
| 6,205,571 B1 * | 3/2001 | Camporese et al. | .......... | 716/114 |
| 6,249,904 B1 * | 6/2001 | Cobb | .............................. | 716/53 |
| 6,269,277 B1 * | 7/2001 | Hershenson et al. | ........... | 700/97 |
| 6,324,673 B1 * | 11/2001 | Luo et al. | ......................... | 716/52 |
| 6,425,117 B1 * | 7/2002 | Pasch et al. | ...................... | 716/53 |
| 6,548,417 B2 * | 4/2003 | Dao et al. | ....................... | 438/710 |
| 6,587,992 B2 * | 7/2003 | Marple | ......................... | 716/122 |
| 6,643,616 B1 * | 11/2003 | Granik et al. | .................... | 703/13 |
| 6,658,640 B2 * | 12/2003 | Weed | .............................. | 716/52 |
| 6,665,856 B1 * | 12/2003 | Pierrat et al. | ..................... | 716/53 |
| 6,670,080 B2 * | 12/2003 | Sugita et al. | ....................... | 430/5 |
| 6,757,886 B2 * | 6/2004 | Liebmann et al. | .............. | 716/54 |
| 6,777,147 B1 * | 8/2004 | Fonseca et al. | ................. | 430/30 |
| 6,839,470 B2 * | 1/2005 | Ikeda | ............................ | 382/266 |
| 6,883,153 B2 * | 4/2005 | Jiang et al. | ..................... | 716/108 |
| 6,928,634 B2 * | 8/2005 | Granik et al. | .................... | 716/52 |
| 6,954,911 B2 * | 10/2005 | Pierrat | ........................... | 716/53 |
| 6,957,411 B1 * | 10/2005 | Teig et al. | ........................ | 716/55 |
| 6,961,920 B2 * | 11/2005 | Zach | ................................ | 716/55 |
| 6,978,438 B1 * | 12/2005 | Capodieci | ........................ | 716/53 |
| 7,003,758 B2 * | 2/2006 | Ye et al. | ........................... | 716/52 |
| 7,013,439 B2 * | 3/2006 | Robles et al. | .................... | 716/53 |
| 7,018,788 B2 * | 3/2006 | Lin | ................................ | 430/394 |
| 7,043,071 B2 * | 5/2006 | Qian et al. | ..................... | 382/144 |

(Continued)

*Primary Examiner* — Naum Levin (57) ABSTRACT

In accordance with the present method and system for improving integrated circuit layout, a local process modification is calculated from simulated process response variables at a set of control points. Said modification values are incorporated into the layout constraints imposed by design rules and design intent to account for manufacturing friendliness. Solving the updated constraint equation with user specified objective function produces a new layout with increased manufacturability. The new layout may further contain data tags that enable optimal process correction to be performed on selected locations, leading to reduction in data size and mask complexity. Also in accordance with this invention, physical design tools are enhanced to read and process anisotropic design rules.

20 Claims, 5 Drawing Sheets

U.S. PATENT DOCUMENTS

| | | |
|---|---|---|
| 7,076,746 B2 * | 7/2006 | Hamlin et al. .................. 716/52 |
| 7,080,349 B1 * | 7/2006 | Babcock et al. ................ 716/53 |
| 7,117,468 B1 | 10/2006 | Teig et al. |
| 7,124,386 B2 * | 10/2006 | Smith et al. ..................... 716/51 |
| 7,194,725 B1 * | 3/2007 | Lukanc et al. .................. 716/52 |
| 7,246,342 B2 * | 7/2007 | Hsu et al. ........................ 716/53 |
| 7,370,403 B1 * | 5/2008 | Hsu et al. ..................... 29/602.1 |
| 7,943,436 B2 * | 5/2011 | McElvain ..................... 438/129 |
| 2001/0032978 A1 * | 10/2001 | Hiromi ............................ 257/48 |
| 2003/0022071 A1 * | 1/2003 | Sugita et al. ....................... 430/5 |
| 2003/0177467 A1 * | 9/2003 | Ohnuma et al. ................. 716/19 |
| 2004/0003368 A1 * | 1/2004 | Hsu et al. ........................ 716/19 |
| 2004/0063000 A1 * | 4/2004 | Maurer et al. .................... 430/5 |
| 2005/0091014 A1 * | 4/2005 | Gallatin et al. ................... 703/2 |
| 2005/0100802 A1 * | 5/2005 | Callan et al. ...................... 430/5 |
| 2005/0134820 A1 * | 6/2005 | Mulder et al. ................... 355/67 |
| 2006/0245636 A1 * | 11/2006 | Kitamura et al. ............. 382/149 |
| 2006/0277520 A1 * | 12/2006 | Gennari ........................... 716/21 |

* cited by examiner

Layout Artwork Terminology

Anisotropic Routing

Figure 7a

Anisotropic Jog Insertion

INTEGRATED CIRCUIT HAVING DIRECTION DEPENDENT WIRING

This application is a continuation of and claims priority to U.S. patent application Ser. No. 12/181,483 filed on Jul. 29, 2008, entitled "METHOD AND SYSTEM FOR ANISOTROPIC INTEGRATED CIRCUIT LAYOUT", now U.S. Pat. No. 8,266,557, entitled "METHOD AND SYSTEM FOR DIRECTION DEPENDENT INTEGRATED CIRCUIT LAYOUT", which is a divisional of and claims priority to U.S. patent application Ser. No. 10/907,814, filed on Apr. 15, 2005, now U.S. Pat. No. 7,448,012, entitled "METHODS AND SYSTEM FOR IMPROVING INTEGRATED CIRCUIT LAYOUT", which claims priority to U.S. Provisional Patent Application Ser. No. 60/564,082 filed on Apr. 21, 2004, and U.S. Provisional Patent Application Ser. No. 60/603,758 filed on Aug. 23, 2004. Above mentioned documents are incorporated herein by reference in their entirety.

FIELD OF THE INVENTION

The present invention relates generally to integrated-circuit manufacturing and more particularly to methods and system for generating and optimizing its layout artwork.

PRIOR ART

In modern processing technology, the manufacturing yield of an integrated circuit depends heavily on its layout construction. For a given manufacturing process, a corresponding set of design rules are applied during chip layout to avoid geometry patterns that can cause chip failure. These design rules guarantee the yield by limiting layout geometry parameters such as minimum spacing, minimal line width, etc.

Existing layout construction systems apply design rules over a wide chip area, and to entire classes of circuits. For this reason, the design rule must cover the worst case in all products. Failure to capture the absolute worst case in all chips would lead to systematic yield failure.

In modern processing technologies such as advanced photolithography, many layout features may interact during chip processing. When the interaction distance increases to greater than a few minimal pitches, the number of interacting features increases sharply. For this reason, the feature dependent interactions are difficult to capture with precise design rules. In practice, one makes global design rule sufficiently relax in order to guarantee the yield.

The drawback of this approach is at least two fold: firstly, it clearly wastes chip area, and secondly, finding the worst case feature combination in all chips is a non-trivial task that consumes large engineering resources.

Some emerging processing technologies also prefer one spatial direction to the other. Existing layout generation systems, however, use identical minimal spacing and minimal width rules for both directions. This leads to waste in chip area and under utilization of processing capability, since the design rules must cover the worst of the two directions.

SUMMARY OF INVENTION

The present invention relates to layout with geometric objects, and more particularly to a system and method for forming layout constraint to account for local and orientation processing dependencies.

The present invention provides a local process modification value to the basic design rule constraint. Local process modification represents an additional safeguard distance beyond the design rule constraint distance. The local process modification value can be calculated from simulated process responses in the region of interest, with a predetermined, often empirical, equation, or from look-up data tables. The original design rule distance plus local process modification effectively creates a new constraint for every unique local situation. With this additional local safeguard, we can reduce the guard band in design rule formulation and improve chip yield by eliminating processing hotspots arising from low probability local feature combinations.

The present invention provides a method that enforces the new local constraints such that simulated local process modification and the original design rule constraint work together to guarantee the chip yield.

For processing technologies with a preferred direction, the present invention constructs two sets of design rule constraint distances for the two orthogonal spatial directions. It constructs layout design systems that can read, store said constraint distances in different memory locations, and apply them according to the orientation of the layout features. By doing so, the layout can fully take advantage of the directional dependence in processing technology.

BRIEF DESCRIPTION OF THE DRAWINGS

The invention is generally shown by way of example in the accompanying drawings in which.

| Definition List 1 | |
|---|---|
| Term | Definition |
| width | Distance of interior-facing edge for a single layer |
| space | Distance of exterior-facing edge for one or two layers |
| overlap | Distance of interior-facing edge for two layers |
| enclosure | Distance of inside edge to outside edge when the polygon of the inside edge is fully inside the polygon of the outside edge |
| extension | Distance of inside edge to outside edge |

DETAILED DESCRIPTION OF THE PREFERRED EMBODIMENTS

Some preferred embodiments of the present invention will be described in detail with reference to the related drawings of FIGS. 1-8. Additional embodiments, features and/or advantages of the invention will become apparent from the ensuing description or may be learned by the practice of the invention.

The methods and apparatus described here are with respect to integrated circuit manufacturing; however, the techniques described here can be applied to manufacturing or design of any device that require pattern transfer from a polygon database drawing to physical materials using lithographic and/or etch methods. Examples of these include integrated optical devices, microelectromechanical systems (MEMS), gene chips, micromachines, disk drive heads, etc.

The following description includes the best mode presently contemplated for carrying out the invention. This description is not to be taken in a limiting sense, but is made merely for describing the general principles of the invention.

The present invention is directed to methods for improving the manufacturing yield of an IC by optimizing its layout pattern.

Figure 1:
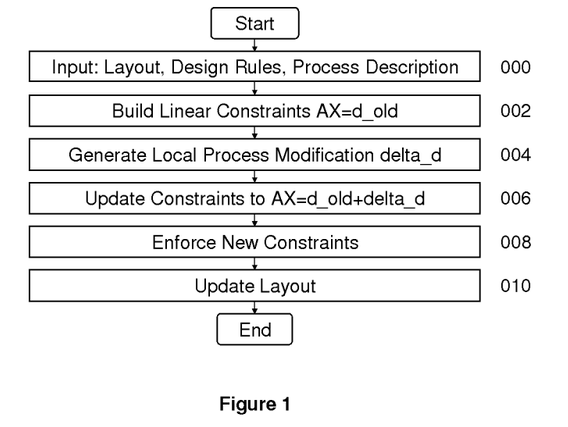
FIG. 1 is a flow and block diagram showing a method and system in accordance with the present invention.

FIG. 1 shows a block and flow diagram for the present invention. In block 000, the original design layout and process description are read into the system. Said design layout comprises a plurality of interrelated layout objects, one or more layers, and can be flat or organized in a hierarchical data structure comprising a plurality of masters, cells, and/or array instances. The relative distances between said layout objects are constrained by design rule and design intent.

The process description comprises design rules, simulation models, manufacturing equipment settings, material options, empirical fitting parameter, and look-up data tables that describe the manufacturing behavior.

Block 002 builds initial linear constraints from the input layout, design rules, and circuit requirements. In a preferred embodiment, well-known procedures, such as the shadow propagation method; is applied to accomplish this task. A description of the procedure can be found in Jurgen Doenhardt and Thomas Lengauer, "Algorithm Aspects of One-Dimensional Layout Compaction", IEEE Trans. Computer-Aided design. Vol. CAD-6 no. 5 Sep. 1987. pp. 863.

Said initial linear constraint equation takes the form $AX=d\_old$, where A is a matrix of coefficients; X is a vector of positional variables comprising location of the polygon edges; and d_old is a column vector of constraint distances. Constraint distances comprise design rule constraint distances and circuit specific design intent. Example of a constraint distance is the minimal line width.

A constraint equation is expressed in the form $x_i - x_j > d_{ij}\_old$, where $x_i$ and $x_j$ are locations of two interacting polygon edges in the layout, and dij_old is the constraint distance between these two edges. The elements of matrix A in this equation are 1 and −1. The vector d_old is a collection of dij_old. The value of dij_old is given by the design rule or by circuit requirements. For example, dij_old can be the minimal width of a wire as required by process capabilities. In another case, it dij_old is the width of a particular wire that is designed to carry a large amount of current where it would be wider than the minimal wire width required by the process alone.

Block 004 generates local process modification values. A local process modification to the design rule constraint distance transforms the global design rule constraints into location specific constraints. Individual evaluation and enforcement of the required safety margin at each critical location enhances the manufacturing yield of a chip. In a preferred embodiment, we calculate local process modification at constrained locations from manufacturing response variables. Details of a preferred embodiment will be discussed in FIG. 3.

Block 006 combines local process modification value delta_dij, with the original constraint distances generated in block 002. A linear constraint equation now takes the form $x_i - x_j > d_{ij}\_new$, where dij_new=dij_old+delta_dij is defined as the local constraint distance. A collection of dij_new values forms the local constraint distance vector, d_new. The system of equations for local constraint takes the form $A*X=d\_new$.

Local constraint distance is a general addition to the constraint distance specified by design rules. Therefore, it can be applied to any physical design system where design rule constrained layout construction and optimization is performed.

Block 008 enforces the local constraint distance to the original layout. Preferred embodiments will be illustrated in FIG. 2.

Block 010 updates the coordinate variables in the layout according to the solution of the enforcement procedure 008.

The present invention modifies a design rule constraint distance, which is global in nature, with a local process modifier to account for specific local conditions. This mechanism adds extra safeguard to the design rule methodology. If a design rule clean layout contains locations with poor process latitude, the local process modifier delta_dij will be larger than that in other places. By enforcing the new local constraint, dij_new=dij_old+delta_dij, the layout is modified to have better process latitude.

For example if two minimally spaced lines tend to bridge due to a particular surrounding condition, the local process modifier will increase the minimal spacing between them, causing the layout edges to moved further apart during enforcement.

Figure 2:
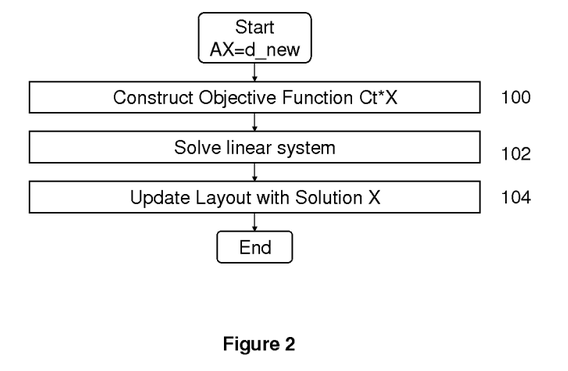
FIG. 2 is a flow and block diagram for enforcing local constraints.

FIG. 2 shows a preferred embodiment for local constraint enforcement. At the start of the procedure, we have a system of equations for local constraint, $AX=d\_new$. The edge locations in the original layout are likely to violate some of the local constraint distances.

Block 100 constructs an objective function $Ct*X$, where Ct is a row vector of coefficients for achieving various optimization objectives, and X is the position variable in the layout. In a preferred embodiment, the objective function together with the linear constraint system removes the new violations introduced by local constraint with minimal perturbation. For example we can use the procedure described by Heng et. al. entitled "A VLSI Artwork Legalization Technique Based on a New Criteria of Minimum Layout Perturbation", ACM/IEEE Intl. Symp. on Physical Design, pp. 116-121, 1997.

By receiving appropriate Ct values, we construct objective functions for wire length minimization, legalization, compaction, and other measurable metrics of layout.

Block 102 solves the linear system problem of minimizing $Ct*X$, subject to $A*X=d\_new$. This is a standard form for a linear programming problem. We use commercial software packages such as CPLEX from ILOG can be used for this purpose.

Block 104 updates the layout with the solution X of the linear system.

In one-dimensional method, the flow is performed one direction at a time, first x(y) then y(x).

In two-dimension method, the flow is performed for horizontal and vertical position variables simultaneously.

In another preferred embodiment, the violations to local constraints are removed one at a time using heuristic procedures. For example, the single error removal procedure described by Zhan Chen, in "Layout and Logic Techniques for Yield and Reliability Enhancement", Ph.D. Thesis, University of Massachusetts Amherst, 1998, can be applied to fix isolated violations. It is particularly useful when processing hotspots are few.

By enforcing new local constraints, we improve the local process latitude. It is a function similar to optimal process correction (OPC). By enforcing local constraints, we can eliminate the need to perform OPC in large portion of layout.

In a preferred embodiment, we tag locations where local constraint enforcement fails or the circuit tolerance is especially tight so that a specially designed OPC system can pick up these location tags and perform localized OPC.

Our experiments show that only small percentages of locations needs OPC after local constraint enforcement. Therefore, the localized OPC procedure will greatly reduce the mask complexity compared to the standard, blanket OPC procedure performed today.

According to the present invention, we calculate the local process modification value at a set of control points that best captures the interaction between the edges.

In a preferred embodiment, a simulation based hotspot detection procedure is first applied to the layout. After that, control points are placed on the offending polygon edges. Hotspot detection comprises simulating the image of the layout and measuring the difference between said image and the design intent. In a preferred embodiment, the difference is represented by the edge placement error (EPE). A processing hotspot is a location where EPE is larger than a predetermined threshold. As an example, the control points can be the same points on the layout where EPE is evaluated.

Figure 3:
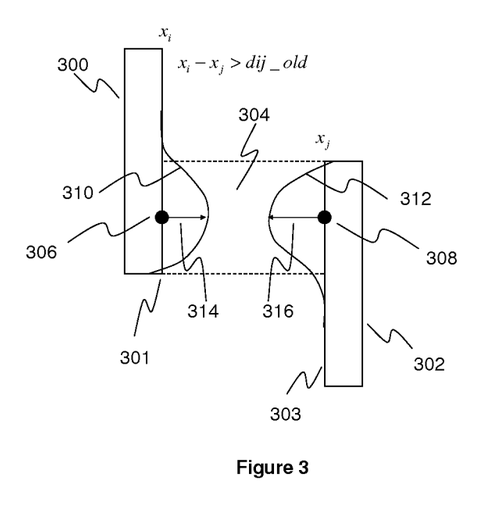
FIG. 3 is a schematic diagram illustrating the calculation of local process modification values.
Figure 4:
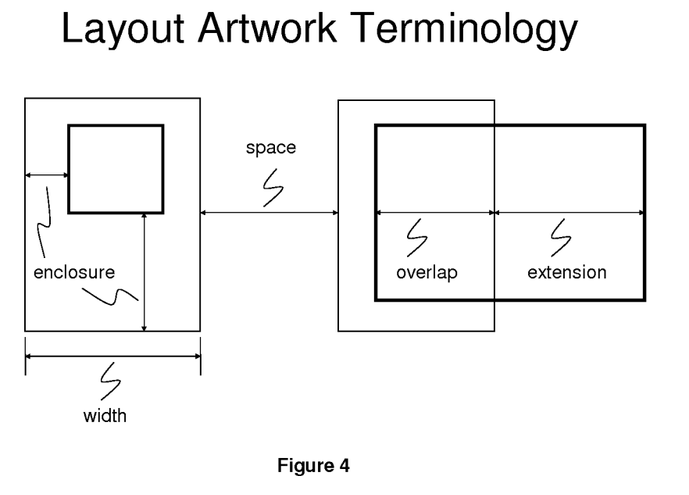
FIG. 4 illustrates the layout artwork terminology.

In another preferred embodiment, we select the control points by inspecting the interaction among the edges. FIG. 3 shows two layout rectangles 300 and 302, which can be on the same layer or on different layers in the layout. The constraint relation xi−xj>dij_old applies to these two edges.

The interaction region between the right edge of 300 at xi (301) and the left edge of 302 at xj (303) is defined by the shadow of 301 on 303, as marked by the band between the two dashed lines, 304. We find the shadow region by placing a hypothetical flashlight to the left of 301 and measure its shadow on 303, which is similar to the procedure used in constraint generation in block 004 of FIG. 1.

After finding the interaction region, we implement a predetermined sampling plan for laying down the control points. In FIG. 3, we place a pair of control points 306 and 308, one on each edge, at the same height, in the middle of the shadow band. We can also use other spatial sampling plans involving a plurality of pairs of points.

After deciding the sampling points (e.g. 306 and 308 in FIG. 3), we simulate various processing response variables at these points. In the photolithography step of IC fabrication, said response variables represent local printability and comprise edge placement error, light intensity during photolithography exposure and its derivatives, contrast, and mask error enhancement factor. A predetermined empirical function is used to calculate the local process modification value from said processing response variables.

For the example in FIG. 3, we select a linear function of edge placement error at point 306 and 308 to calculate local process modification. Edge placement error, (314/316 for the left/right edge) is defined as the perpendicular distance from intended edge location (xi/xj for the left/right edge) to the simulated edge location as predicted by process simulation, (310/312 for the left/right edge).

Once the edge placement errors are calculated for the two interacting edges, the local process modification value is expressed as w1*EPE_i+w2*EPE_j, where EPE_i 314 and EPE_j 316 are the edge placement errors at 306 and 308 respectively, and w1 and w2 are user specified constants. Local constraint for edges 301 and 303 can now be expressed as dij_new=dij_old+w1*EPE_i+w2*EPE_j.

Variations in functional forms for local process modification can be constructed and additional process variables can be used in order to cover the specific needs of a particular application.

In another preferred embodiment, the local process modification value is obtained from a predetermined look-up data table. The key to the look-up data table is a set of geometry combinations that appear frequently in the layout, such as the two rectangle case show in FIG. 3. The application uses pattern recognition capability to identify the pattern key and search the look-up table in order to obtain appropriate local process modification value. This embodiment is advantageous when good simulation accuracy cannot be obtained, and the interaction is limited to a short range.

The local process modifications discussed so far are microscopic correction to the design rule constraints. In modern processing technology, there are also systematic corrections to design rules on a larger scale. For example, in immersion lithography, one can utilize the polarization property of the imaging light to achieve higher image resolution in a preferred direction. Another example is the crystal orientation dependence in device performance. According to the present invention, we formulated two sets of design rule distances, one set for horizontal dimensions and another set for vertical dimensions in order to achieve best chip performance. We construct physical layout tools to utilize these two separate constraint distances. The optimal layout for these technologies are anisotropic in that the horizontal and vertical directions obey different constraints for minimal space, line width, overlap, enclosure, and extension rules. The exact definition of these geometry terms are listed in Definition List 1 and illustrated in FIG. 4.

Design rules that have different constraint distances for horizontal and vertical directions are defined as anisotropic design rules. The layout that satisfy anisotropic design rules are defined as anisotropic layout.

Design rules that have the same constraint distances for horizontal and vertical directions are defined as isotropic design rules, or simply design rules. The layout that satisfy isotropic design rules are defined as isotropic layout.

The present invention comprises layout systems that are capable of generating and optimizing layout artwork for a direction dependent processing technology.

In accordance with the current invention, we design a set of simple test patterns with parameterized critical dimensions. The parameter values are selected such that they vary from the value when said pattern can be successfully fabricated to a value at which the fabrication clearly fails. We extract the design rules by finding and recording the parameter value at which the test pattern can be successfully fabricated under all allowable processing conditions, i.e. the process window.

In a preferred embodiment, two separate sets of test patterns are fabricated. One set comprises geometries oriented along the vertical direction. The other set comprises geometries oriented along the horizontal direction. For example, one set has line and space gratings running along the vertical direction; the other set has the same running along horizontal direction. The variable parameters in this example are line width and space width. Extracted design rules from this set of test patterns represent distance constraints for line width and space width in horizontal and vertical directions.

For a direction dependent processing technology, the present invention extracts two distinctive sets of constraint parameters to form an anisotropic design rule set.

Figure 5:
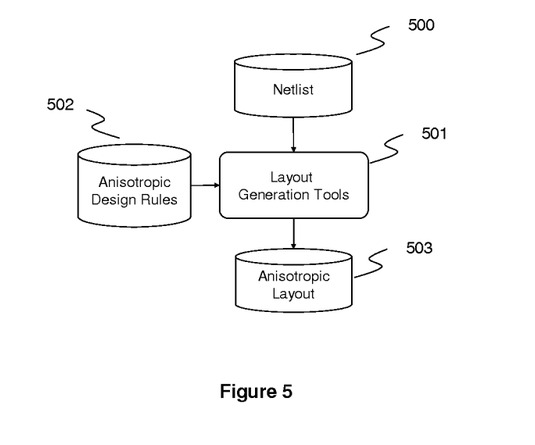
FIG. 5 is a block diagram for generating anisotropic layout artwork.

FIG. 5 shows a flow diagram for generating optimal layout for a direction dependent processing technology. Starting with design database that contains the circuit netlist and performance target (500), we apply a set of software tools (501) to create a polygonal layout for fabrication. These tools comprise layout editors, placement and routing tools, layout compaction tools, and standard cell generators etc. The tool collection (501) uses anisotropic design rules (502) to restrict the relative positioning of polygon edges based on the orientation of the edge.

Figure 6:
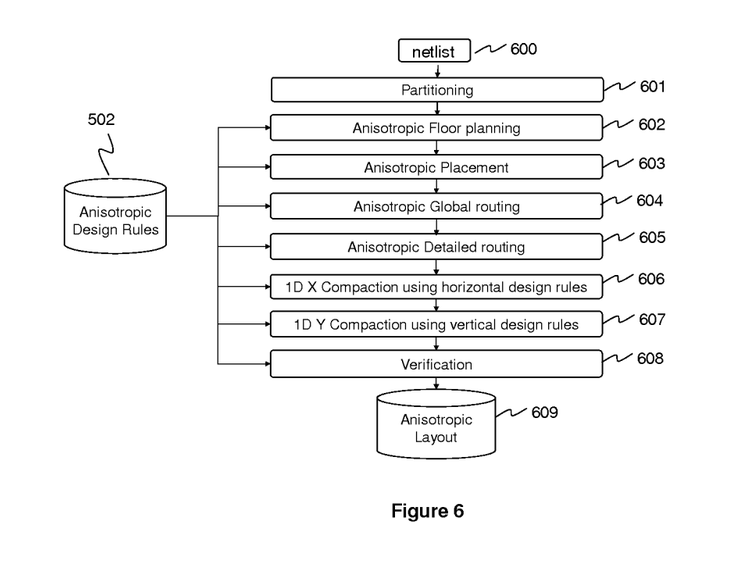
FIG. 6 is a flow diagram for anisotropic layout generation.

In a preferred embodiment, FIG. 6 shows a flow diagram for generating layout for an anisotropic image system. The steps performed in FIG. 6 uses a subset of the tool collection 501.

During floor planning (602) and placement (603), a preferred orientation of the image system is used to optimize the shape, position and orientation of the circuit building blocks. More circuit element can be accommodated in the direction with higher resolution, while the direction with lower resolution has lower line-to-line parasitic capacitance and lower resistance. In routing modules 604 and 605, wiring direction dependent design rules from the memory are used for identifying obstacles, setting wire width and spacing, and estimating resistance and capacitance.

Figure 7A:
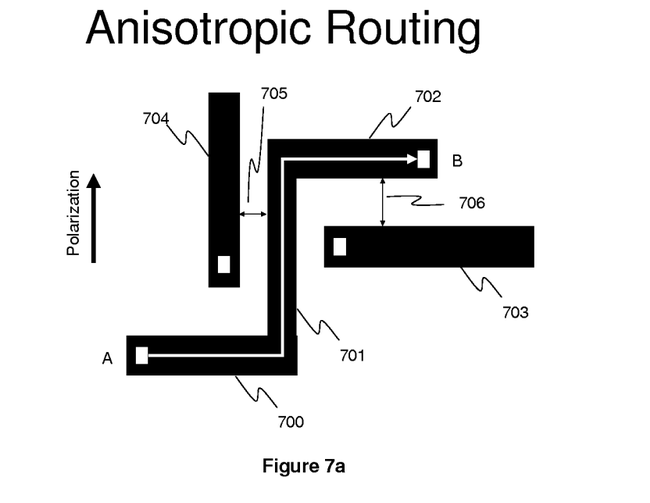
FIG. 7 illustrates orientation dependent routing.

FIG. 7a shows a basic operation during wire routing. A wire is constructed by the routing algorithm to connect two points, A and B. In a preferred embodiment, starting from point A, while the wire is running horizontally (700), the application fetches the minimal width of the horizontal wire from the memory and applies it to limit the current wire segment. After turning 90 degrees (701), the wire now is running along the vertical direction, the application fetches the minimal width of the vertical wire from a different memory location and applies it to limit the minimal line width.

The wire is also kept at safe distances away from obstacles 703 and 704 using directional dependent minimal spacing rules. In a preferred embodiment, the layout generation system compares the separation 705 between vertical line segments 701 and 704, with the minimal spacing rule between vertical lines and reports error when this horizontal constraint is violated. Said system compares the separation 706 between horizontal line segments 702 and 703, with the minimal spacing rule between horizontal lines and reports error when this vertical constraint is violated. In prior art physical design systems the minimal values for 705 and 706 are the same and equal to the minimal space rule, which is kept at the same memory location in the design system.

Figure 7B:
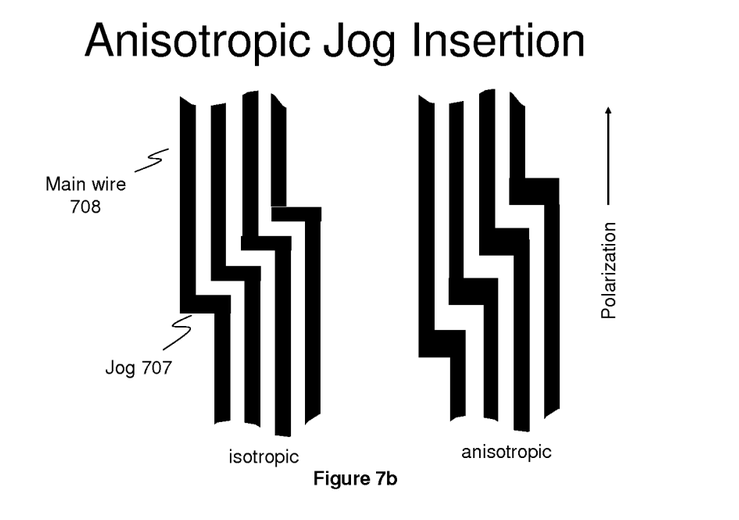

FIG. 7b illustrates the procedure for wire jog insertion. In layout systems, interconnect needs to be converted from paths that have no width information to actual layout wires. The preferred width is specified in the technology file. In a preferred embodiment, two numbers representing preferred wire width in vertical and in horizontal direction are read from different input fields. During path to wire conversion, the main wire portion 708 uses width and spacing width for the vertical wires, while jog portion 707 uses width and spacing rules for horizontal wires.

In another preferred embodiment, design rule verification and compaction programs in FIG. 6 are constructed to accept and process anisotropic design rules. For example, the corner to corner constraint on a layout layer my now be expressed as $sqrt(d\_h*d\_h+d\_v*d\_v)$, where $d\_h$ and $d\_v$ are horizontal and vertical constraint distances respectively. In contrast, in an isotropic layout system, said corner constraint is $sqrt(2)*d0$, where $d0$ is the isotropic constraint distance.

Figure 8:
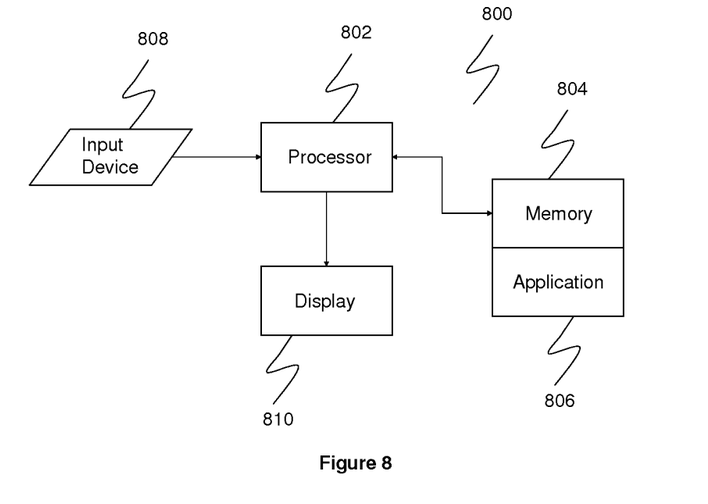
FIG. 8 is a block diagram showing a system for implementing the present invention.

Referring to FIG. 8, a block/flow diagram is shown for a system 800 of the present invention. System 800 includes a processor 802 that accesses memory device 804. Memory device 804 stores an application software package 806 for implementing the present invention. A user interfaces with the processor 802 through an input device 808 which may include a keyboard, a mouse, a touch screen monitor, a voice recognition system or other known input devices. A display 810 is also included to display results, prompts, user inputs, graphics, etc.

While the present invention has been described in detail with regards to the preferred embodiments, it should be appreciated that various modifications and variations may be made in the present invention without departing from the scope or spirit of the invention. In this regard, it is important to note that practicing the invention is not limited to the applications described hereinabove. Many other applications and/or alterations may be utilized if such other applications and/or alterations do not depart from the intended purpose of the present invention.

It should further be appreciated by a person skilled in the art that features illustrated or described as part of one embodiment can be used in another embodiment to provide yet another embodiment such that the features are not limited to the specific embodiments described above. Thus, it is intended that the present invention cover such modifications, embodiments and variations as long as such modifications, embodiments and variations come within the scope of the appended claims and their equivalents.

What is claimed is:

1. An integrated circuit product comprising:
   a plurality of connection points;
   at least one layer comprising routing wires connecting said connection points;
   a first set of routing wires in said layer connecting along a first direction;
   a second set of routing wires in said layer connecting along a second direction, said second direction being orthogonal to said first direction; and
   said first set of routing wires having wire width values substantially different from the wire width values of said second set of routing wires.

2. The integrated circuit product of claim 1, wherein said first set of routing wires have wire to wire spacing values substantially different from the wire to wire spacing values of said second set of routing wires.

3. The integrated circuit product of claim 1, wherein one or more wire segments in said first set of routing wires abut one or more wire segments in said second set of routing wires, whereby forming bending wires having substantially different wire width values between connected orthogonal wire segments.

4. The integrated circuit product of claim 1, wherein said first direction rotates by 90 degrees between adjacently located said layers.

5. The integrated circuit product of claim 1, wherein said first direction coincides with a predefined preferred routing direction.

6. The integrated circuit product of claim 1, wherein said first set of routing wires have a minimal wire width value that is substantially smaller than the minimal wire width value of said second set of routing wires.

7. The integrated circuit product of claim 1, wherein said first set of routing wires have a minimal wire to wire spacing value that is substantially smaller than the minimal wire to wire spacing value of said second set of routing wires.

8. The integrated circuit product of claim 1, wherein said second set of routing wires consisting essentially of wires having larger widths than wires in said first set of wires.

9. The integrated circuit product of claim 1, wherein said second set of routing wires consisting essentially of wires having larger wire to wire spacing than wires in said first set of wires.

10. An integrated circuit product comprising:
a chip area comprising a plurality of vias;
at least one metal layer comprising metal wires connecting said vias;
a first set of said metal wires connecting along a first direction;
a second set of said metal wires connecting along a second direction, said second direction being orthogonal to said first direction; and
said first set of said metal wires having substantially different wire width from said second set of said metal wires.

11. The integrated circuit product of claim 10, wherein said first set of said metal wires have substantially different pitch from said second set of said metal wires.

12. The integrated circuit product of claim 10, wherein one or more wire segments in said first set of said metal wires abut one or more wire segments in said second set of said metal wires, whereby forming one or more bending wires having substantially different wire width values between abutted orthogonal wire segments.

13. The integrated circuit product of claim 10, wherein said first direction rotates by 90 degrees between adjacently located said at least one metal layers.

14. The integrated circuit product of claim 10, wherein said first direction coincides with a predefined preferred routing direction.

15. The integrated circuit product of claim 10, wherein said second set of said metal wires having a minimal wire width value substantially larger than the minimal wire width value of said first set of said metal wires.

16. The integrated circuit product of claim 10, wherein said second set of said metal wires having a minimal pitch substantially larger than the minimal pitch of said first set of said metal wires.

17. The integrated circuit product of claim 10, wherein said second set of metal wires consisting essentially of wires having substantially larger wire width values than wires in said first set of wires.

18. The integrated circuit product of claim 10, wherein said second set of metal wires consisting essentially of wires having substantially larger pitch than wires in said first set of wires.

19. An integrated circuit product prepared by a process comprising the steps of:
providing a plurality of connection points;
providing at least one metal layer comprising routing wires;
loading a first wire width constraint for a first set of routing wires oriented along a first direction in said metal layer;
loading a substantially different second wire width constraint for a second set of routing wires oriented along a second direction in said metal layer, said second direction being orthogonal to said first direction; and
functionally connecting said connection points using said first set of routing wires along said first direction, and using said second set of routing wires along said second direction.

20. The integrated circuit product of claim 19, further comprising the steps of:
loading a first pitch constraint for said first set of routing wires; and
loading a substantially different second pitch constraint for said second set of routing wires.

* * * * *